(12) United States Patent
Kang

(10) Patent No.: US 6,180,482 B1
(45) Date of Patent: Jan. 30, 2001

(54) METHOD FOR MANUFACTURING HIGH DIELECTRIC CAPACITOR

(75) Inventor: Chang-seok Kang, Kyungki-do (KR)

(73) Assignee: Samsung Electronics, Co., Ltd., Suwon (KR)

(*) Notice: Under 35 U.S.C. 154(b), the term of this patent shall be extended for 0 days.

(21) Appl. No.: 09/123,493

(22) Filed: Jul. 28, 1998

(30) Foreign Application Priority Data

Jul. 30, 1997 (KR) .................................................. 97-36165

(51) Int. Cl.⁷ ................................................... H01L 21/20
(52) U.S. Cl. ......................... 438/396; 438/398; 438/238; 438/240; 438/253; 438/381; 438/393
(58) Field of Search ............................ 438/238, 396, 438/398, 901, 240, 253, 381, 393, 3

(56) References Cited

U.S. PATENT DOCUMENTS

| | | | |
|---|---|---|---|
| 5,390,072 | * | 2/1995 | Anderson et al. .................... 361/313 |
| 5,587,870 | * | 12/1996 | Anderson et al. .................... 361/313 |
| 5,626,728 | * | 5/1997 | Ramakrishnan et al. ........ 204/192.18 |
| 5,843,829 | * | 12/1998 | Kuramae et al. ..................... 438/396 |
| 5,985,676 | * | 11/1999 | New .......................................... 438/3 |

OTHER PUBLICATIONS

Takaaki Kawahara et al., (Ba, Sr) TiO3 Films Prepared by Liquid Source Chemical Vapor Deposition on Ru Electrodes, Jpn J Appl Phys., vol. 35 (1996), pp. 4880–4885.

Cheol–Seong Hwang et al., Deposition of extremely thin (Ba,Sr) TiO3 thin films for ultra–large–scale integrated dynamic random access memory application, American Institute of Physics, (1995) pp. 2819–2821.

* cited by examiner

Primary Examiner—Matthew Smith
Assistant Examiner—Victor Yevsikov
(74) Attorney, Agent, or Firm—Marger Johnson & McCollom, P.C.

(57) ABSTRACT

A method for manufacturing a high dielectric capacitor is provided. A capacitor cell unit comprised of an amorphous, high dielectric film which is formed on a semiconductor substrate. Next, the amorphous high dielectric film is crystallized by annealing the capacitor cell unit under a non-oxidizing atmosphere.

20 Claims, 6 Drawing Sheets

METHOD FOR MANUFACTURING HIGH DIELECTRIC CAPACITOR

BACKGROUND OF THE INVENTION

1. Field of the Invention

The present invention relates to a method for manufacturing a very-large-scale-integrated (VLSI) semiconductor device, and more particularly, to a method for manufacturing a capacitor for a VLSI semiconductor device. The present application is based on, and priority is claimed from, Korea Patent Application No. 97-36165, filed Jul. 30, 1997, which is incorporated herein by reference for all purposes.

2. Description of the Related Art

Recently, many efforts to increase capacitance within a limited cell area have been focused on using thin films of high dielectric constant material, e.g., a high dielectric constant material having a perovskite structure. In order to be useful as a high dielectric constant thin layer for a capacitor, a material must meet the following requirements: (1) low leakage current; (2) large dielectric constant; and (3) excellent step coverage.

A method for decreasing the leakage current level of a high dielectric constant thin film while improving the dielectric constant is disclosed by Hwang et al. in a thesis entitled "Deposition of Extremely Thin (Ba, Sr) TiO$_3$ Thin Films for Ultra-Large-Scale Integrated Dynamic Random Access Memory Application," Appl. Phys. Lett. 67(19), Nov. 6, 1995. According to this thesis, after forming a lower electrode, a (Ba, Sr) TiO$_3$ (BST) film is deposited at a substrate temperature of 660° C. using a sputtering technique. Subsequently, the BST film is annealed under a nitrogen (N$_2$) atmosphere at a temperature of 750° C. It has been known that leakage current of a capacitor decreases and dielectric constant is improved when the BST film is annealed under an N$_2$ atmosphere, since a potential barrier is formed between an electrode and a BST film. However, according to this thesis, since the BST film is deposited by sputtering technique, step coverage of the BST film is lowered to 50% or less.

Compared to the BST film formed by sputtering technique, a BST film formed by a chemical vapor deposition (CVD) method shows improved step coverage. However, as the chemical vapor deposition temperature for forming the BST film is increased, the step coverage of the BST film is reduced. Accordingly, the step coverage of the BST film which can be achieved is limited so long as the BST film is formed at a deposition temperature of 500° C. or more. On the other hand, when the BST film is formed at a temperature less than about 500° C., step coverage is improved while dielectric constant of the BST film is decreased.

A method for manufacturing a capacitor having a BST film with improved step coverage and dielectric constant, is disclosed by T. Kawahara et. al. in a thesis entitled "(Ba, Sr) TiO$_3$[BST] Films Prepared by Liquid Source Chemical Vapor Deposition on Ru Electrode," Jpn. J. Appl. Phys. Vol. 34, 1996, pp 5077–5082. According to this method, a lower electrode is formed on a semiconductor substrate. A first BST buffer film is then deposited on the electrode at a substrate temperature of about 420° C. and to a thickness of 50~60 Å. Subsequently, the first BST film is annealed at 700° C. under a nitrogen (N$_2$) atmosphere. Successively, the substrate temperature is set again to 420° C., and a second BST film is deposited on the first BST film. Next, the substrate temperature is raised to 700° C. and the second BST film is annealed and crystallized. An upper electrode is then formed on the crystallized second BST film, thereby completing the capacitor. The capacitor formed in this way has improved electrical properties because the BST film is annealed at high temperature under an N$_2$ atmosphere, and the BST film step coverage is increased because the BST film is formed at low temperature. According to this method, however, a two-step process must be repeatedly performed, that is, a deposition step and an annealing step is sequentially repeated twice. Thus, the fabrication process is complex. To simplify the fabrication process, the BST film may be annealed at 700° C. under N$_2$ atmosphere immediately after forming the BST film by a single step. However, in this case, the leakage current of the capacitor is increased and the dielectric constant thereof is lowered.

SUMMARY OF THE INVENTION

To solve the above problems, it is an object of the present invention to provide a simplified method for manufacturing a capacitor which provides increased step coverage of a high dielectric film and improved electrical properties of the capacitor.

According to an aspect of the present invention for achieving the above object, a capacitor cell unit comprising a high dielectric film including an amorphous portion is formed on a semiconductor substrate. Next, the capacitor cell unit is annealed to crystallize the high dielectric film amorphous portion.

The capacitor cell unit comprised of the high dielectric film including an amorphous portion is formed as follows. First, a first conductive film pattern is formed on a semiconductor substrate. A high dielectric film including an amorphous portion is formed on the first conductive film pattern. Next, a second conductive film is formed on the high dielectric film. The second conductive film and the high dielectric film are then sequentially patterned to form the capacitor cell unit.

The high dielectric film is formed by depositing the high dielectric material from a chemical vapor at a temperature where step coverage of the high dielectric film exceeds 80%. Alternatively, the high dielectric layer may be formed by sputtering. The temperature at which the step coverage exceeds 80% is 480°C. or less. As the high dielectric material, it is preferred to employ one selected from the group consisting of SrTiO$_3$, (Ba, Sr)TiO$_3$, PbZrTiO$_3$, SrBi$_2$Ta$_2$O$_9$, (Pb, La)(Zr, Ti)O$_3$ and Bi$_4$Ti$_3$O$_{12}$. Also, the first conductive film pattern and the second conductive film are preferably formed of a material resistant to oxidation, i.e., a platinum group metal or an oxide thereof. The crystallization of the high dielectric film amorphous portion is achieved by annealing the capacitor cell unit at 500~800° C. under a non-oxidizing atmosphere.

According to the present invention, improved step coverage is achieved by depositing the high dielectric film at a temperature where step coverage exceeds 80%. After forming an upper electrode, the resultant structure is annealed under a non-oxidizing atmosphere, thereby crystallizing the amorphous portion of the high dielectric film. The dielectric constant of the high dielectric film is thereby increased and the leakage current of the capacitor is decreased. Since the amorphous portion of the high dielectric film is crystallized by a single-step annealing process, the fabrication process is simplified.

These objects aspects of the invention will be described in greater detail by reference to the drawings.

DESCRIPTION OF THE PREFERRED EMBODIMENTS

Figure 1:
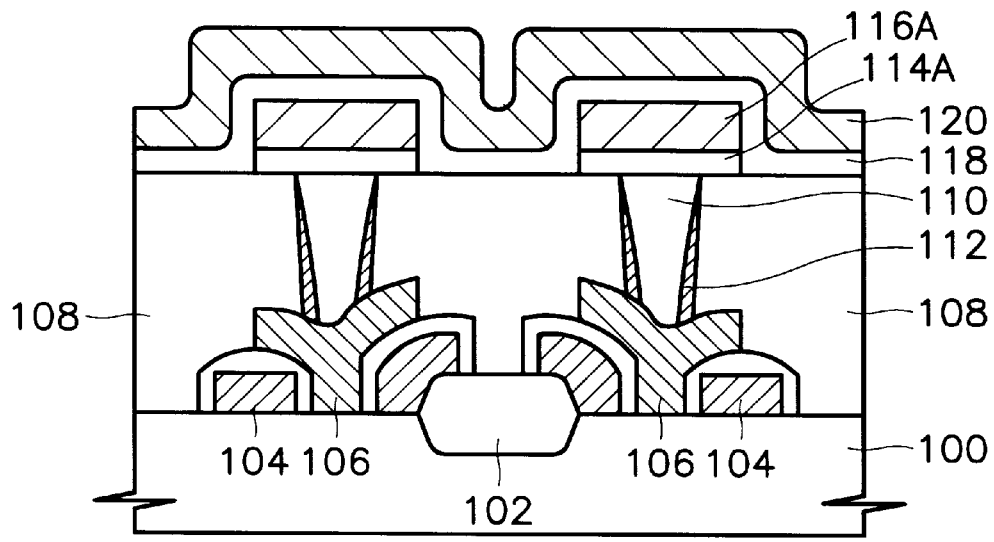
FIGS. 1 through 3 are sectional views of intermediate structures illustrating a method for manufacturing a capacitor, according to an embodiment of the present invention.

Hereinbelow, preferred embodiments of the present invention will be described in detail with reference to the accompanying drawings. The present invention is not restricted to the embodiments disclosed hereinbelow, and may be implemented in various different ways. However, these embodiments are provided for making the disclosure of the invention complete, and for informing those skilled in the art of the exact scope of the invention. Throughout the accompanying drawings, the thicknesses of various films and regions are exaggerated for clarity. Also, when it is written that a film is present on another film or a substrate, the film may be present directly thereon, or another film may be present therebetween. In the drawings, the same reference numerals represent the same elements.

A method for manufacturing a capacitor according to the present invention will be explained with reference to FIGS. 1 through 3. Referring to FIG. 1, an isolation region 102 is formed on a semiconductor substrate 100 by a LOCal Oxidation of Silicon (LOCOS) method. Subsequently, after forming a gate electrode 104, an impurity is ion-implanted to form a source/drain region, thereby completing a transistor. Next, a pad electrode 106 is formed between neighboring gate electrodes 104, and then an interlayer insulating film 108 for insulating and planarizing a device is formed. The interlayer insulating film 108 is formed of a borophsphorous silicate glass (BPSG) or a silicon oxide film, by a chemical vapor deposition (CVD) method. A contact hole exposing the pad electrode 106 is formed by etching the interlayer insulating film 108, and then a plug 110 is formed by filling polysilicon into the contact hole. Before filling the contact hole with polysilicon, a spacer 112 may be formed of a nitride film for protecting side walls of the contact hole.

Subsequently, a diffusion preventing film pattern 114A and a lower electrode film pattern 116A are formed by sputtering. The diffusion preventing film pattern 114A is formed for preventing the impurities or silicon doped into a conductive material of the semiconductor substrate 100 and the polysilicon plug 110 from being diffused into the lower electrode film pattern 116A. Therefore, the diffusion preventing film pattern 114A is formed of a metal nitride film such as a titanium nitride (TiN) film, a tantalum nitride (TaN) film or a tungsten nitride (WN) film, or a metal oxide film such as a ruthenium oxide ($RuO_2$) film. The lower electrode film pattern 116A is formed of a single layer or a complex layer, by using a material having a high resistance to oxidation. The material is preferably oxidation resistant to avoid being oxidized when the material contacts the high dielectric film formed during a subsequent step. Therefore, a platinum group metal such as platinum (Pt), ruthenium (Ru), iridium (Ir) or palladium (Pd), or an oxide thereof, is preferred. Such a material also has a larger work function than the high dielectric material, so that a Schottky barrier is formed at the interface between the oxidation-resistant material and the high dielectric material, thereby improving leakage current characteristics. Next, an amorphous high dielectric film 118 is formed on the lower electrode film pattern 116A. As used herein, an amorphous high dielectric film is intended to mean a high dielectric film having only a portion which is amorphous, or which is substantially amorphous throughout. The amorphous high dielectric film 118 is formed by chemical vapor deposition (CVD) or sputtering. Where formed by CVD, the amorphous high dielectric film 118 is formed at a temperature of 480° C., at which deposition temperature step coverage of the high dielectric film 118 is at least about 80%. The high dielectric film 118 is preferably formed of $Ta_2O_5$ or a ferroelectric film having a perovskite structure. More preferably, one ferroelectric film selected from the group consisting of $SrTiO_3$ (STO), (Ba, Sr)$TiO_3$ (BST), $PbZrTiO_3$ (PZT), $SrBi_2Ta_2O_9$ (SBT), (Pb, La)(Zr, Ti)$O_3$ and $Bi_4Ti_3O_{12}$ is used. For example, in the case of forming the high dielectric film 118 using BST, to attain step coverage higher than or equal to 80%, the temperature of the semiconductor substrate must be set to 480° C. or less.

An upper electrode film 120 is then formed on the amorphous high dielectric film 118. The upper electric film 120 is formed of a material having a high resistance to oxidation, like the lower electrode film pattern 116A.

Preferably, the upper electrode film 120 is formed of a single layer or a complex layer, comprised of a platinum group metal such as platinum (Pt), ruthenium (Ru), iridium (Ir), palladium (Pd) or an oxide thereof.

Figure 2:
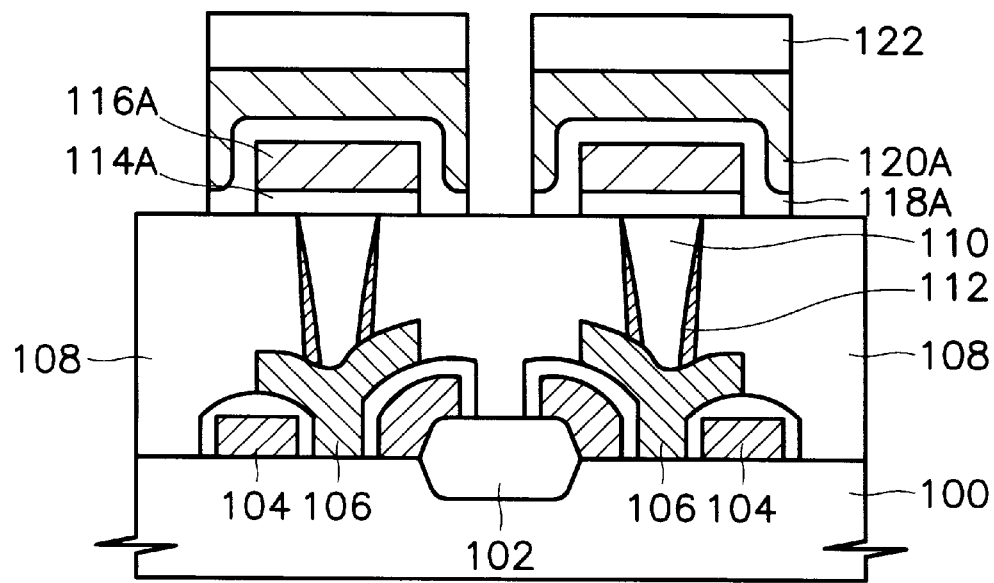

Referring to FIG. 2, the upper electrode film 120 and the amorphous high dielectric film 118 are sequentially etched by an anisotropic etching method using a predetermined mask pattern 122, thereby forming separate capacitor cell units, each comprised of the upper electrode pattern 120A, the amorphous high dielectric film pattern 118A, the lower electrode pattern 116A and the diffusion preventing film pattern 114A.

Figure 3:
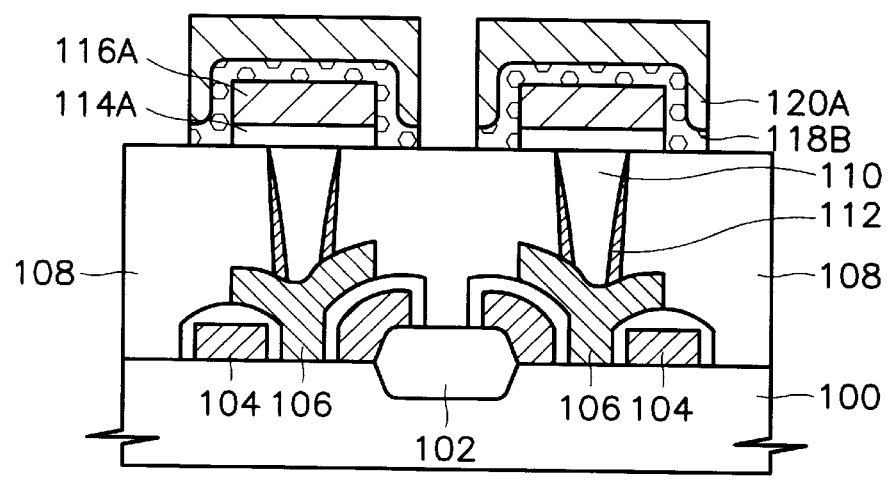

Referring to FIG. 3, after removing the mask pattern 122, the capacitor cell unit is annealed to crystallize the high dielectric film pattern 118A thereby forming a crystallized high dielectric film pattern 118B to thus complete the capacitor cell unit.

The annealing step for crystallization is performed in the temperature range where the amorphous material is completely changed into a crystalline state. Also, the annealing step is performed in the temperature range where other film materials already formed on the semiconductor substrate are not degraded. Therefore, the annealing step for crystallization is preferably performed at 500~800° C. under non-oxidizing atmosphere. The annealing time is preferably 10 minutes to 2 hours, and more preferably 15 to 60 minutes. As the high dielectric film pattern 118A crystallized into high dielectric film pattern 118B by the annealing step, the dielectric constant of the high dielectric film pattern 118B is increased and the interfaces between the high dielectric film pattern 118B and the upper and lower electrode film patterns 120A and 116A are stabilized, thereby lowering the leakage current. Also, any etching damage to the amorphous high dielectric film pattern 118A caused by the dry etching for forming the capacitor cell unit is cured.

The present invention will be described in more detail through the following examples, but the invention is not limited thereto. For example, although high dielectric films are formed using BST throughout the following examples, other high dielectric materials may be employed.

EXAMPLE 1

Observation of Relationship Between Deposition Temperature of BST Film and Step Coverage To verify the relationship between the deposition temperature and step coverage of a BST film, a plurality of oxide film patterns having a width of 0.6 μm and a height of 0.9 μm were formed on a plurality of semiconductor substrates with a spacing of 0.6 μm. The plurality of semiconductor substrates were divided into four groups. The substrate temperatures were made different from one another, i.e., 425° C., 475° C., 525° C. and 575° C. A thin BST film was then deposited on each by a CVD method according to deposition conditions shown in Table 1. The step coverage of a deposited BST film {(thickness of BST film deposited at the side walls of an oxide film pattern/thickness of the same deposited on top of the oxide film pattern)×100} is demonstrated in the following Table 2 and FIG. 4.

TABLE 1

Deposition conditions of BST film

| Item | Condition |
| --- | --- |
| Substrate temperature | 425° C. |
| Reaction chamber pressure | 1 Torr |
| Reaction gases | Ba(DPM)$_2$/tetraglyme (0.15 mol/L) |
|  | Sr(DPM)$_2$/tetraglyme (0.15 mol/L) |
|  | Ti(DPM)$_2$/(O-I-Pr) (0.15 mol/L) |
| Flow rate of reaction gas | Ba:Sr:Ti = 26:26:48 (sccm) |
| Solvent | n-butyl acetate |
| Flow rate of carrier gas (Ar) | 200 (sccm) |
| Flow rate of oxidizing agents (O$_2$ and N$_2$O) | 200:200 (sccm) |
| Temperature of vaporizer | 240° C. |
| Injection amount of reaction gas | 0.1 (ml/min) |

TABLE 2

Substrate temperature and step coverage of BST film

| Substrate | Substrate temperature (° C.) | Step coverage (%) |
| --- | --- | --- |
| 1 | 425 | 87 |
| 2 | 475 | 83 |
| 3 | 525 | 43 |
| 4 | 575 | 40 |

Figure 4:
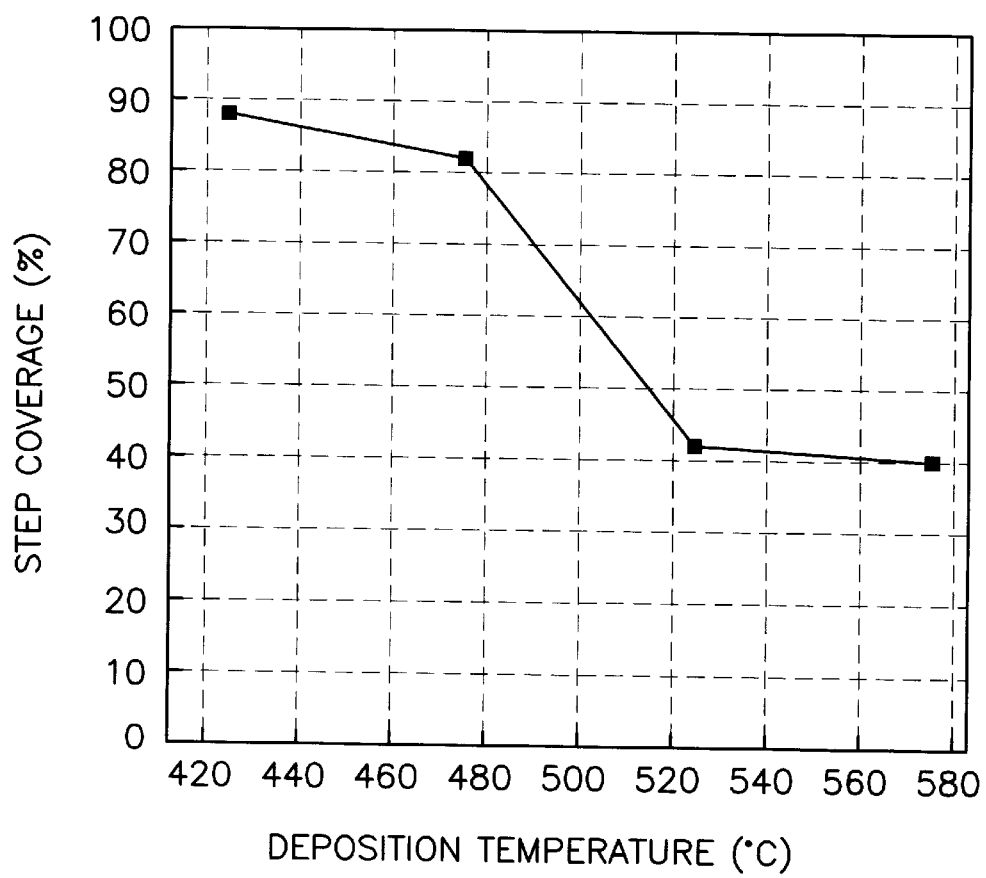
FIG. 4 is a graph showing the relationship between a deposition temperature of a BST film and a step coverage thereof.

As demonstrated in Table 2 and FIG. 4, as the substrate temperature was increased, the step coverage of the BST film was noticeably reduced. Particularly, at a temperature of over about 480° C., the step coverage was lowered to a processing margin level, i.e., 80%, or less. Thus, it is understood that to enhance the step coverage of the BST film, the substrate temperature is preferably set to about 480° C. or less.

According to the result of the first example, if the BST film is deposited at a substrate temperature lower than or equal to 480° C., an amorphous BST film is formed with increased step coverage. In other words, either a BST film which is entirely amorphous or a BST film which is a mixture of amorphous and crystalline states is formed. The amorphous BST film exhibits inferior characteristics, that is, a low dielectric constant and a high leakage current. Therefore, the amorphous BST film must be crystallized to improve electrical characteristics of a capacitor which incorporates the BST film as a dielectric film.

The following Examples 2 through 7 were conducted to find out the most appropriate conditions and timing for crystallization of a BST film. The BST films were formed in the following manner throughout the following embodiments. First, a silicon oxide and a first Pt a lower electrode film were formed on a semiconductor substrate to thicknesses of 1000 Å, respectively. Then, according to the deposition conditions demonstrated in Table 1, 400 Å thick BST films were formed by a metal organic chemical vapor deposition (MOCVD) method.

EXAMPLE 2

Observation of Relationship Between Performance of Annealing on BST Film and Leakage Current After forming BST films according to the conditions demonstrated in Table 1, a plurality of substrates were deposited with BST films and divided into two groups. Annealing was not performed on the substrates in the first group, and a second Pt film for an upper electrode was formed directly on the BST film to a thickness of 1000 Å For the second group, annealing was performed at 750° C. for 30 minutes, and then a second Pt film was formed on the annealed BST film using the same process as above. Subsequently, voltages of +1.5 V and −1.5 V were applied to the substrates of the respective groups, to measure leakage current characteristics. The results thereof were indicated in Table 3 and FIG. 5.

TABLE 3

Performance of annealing on BST film and leakage current

| Annealing | Leakage current (A/cm$^2$) |
| --- | --- |
| No | $1.7 \times 10^{-6}$ |
| Yes (750° C., 30 minutes) | $\geq 1 \times 10^{-3}$ |

Figure 5:
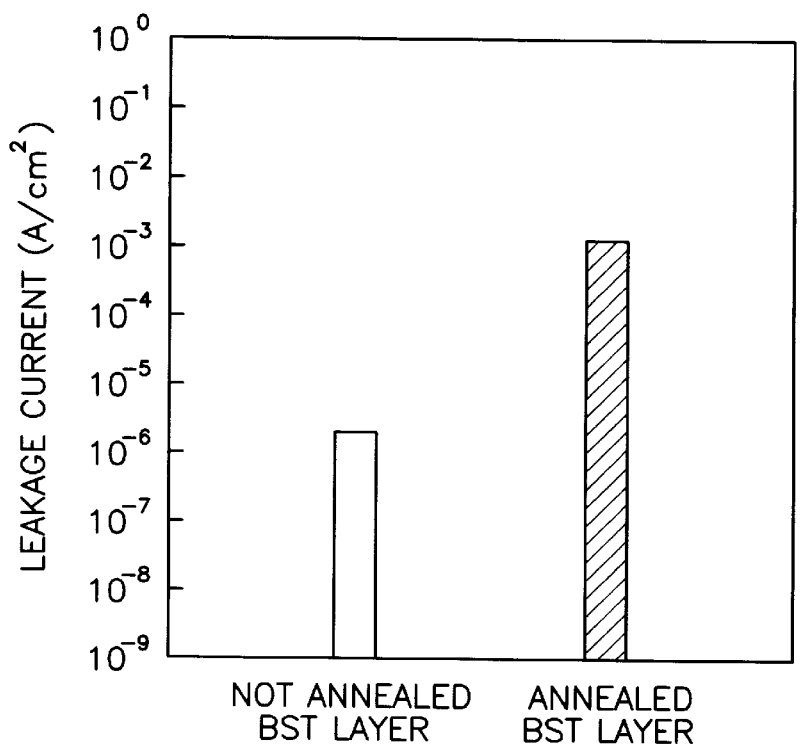
FIG. 5 is a graph showing leakage current of a capacitor in the cases of performing and of not performing annealing of a BST film after forming the same.

As demonstrated in Table 3 and FIG. 5, the leakage current level in the case of performing annealing immediately after depositing the BST film was $1 \times 10^{-3}$ or more, which was much higher than that in the case of performing no annealing, i.e., $1.7 \times 10^{-6}$. In other words, it was understood that annealing immediately after depositing the BST film might deteriorate the leakage current characteristics of a capacitor.

EXAMPLE 3

Figure 6:
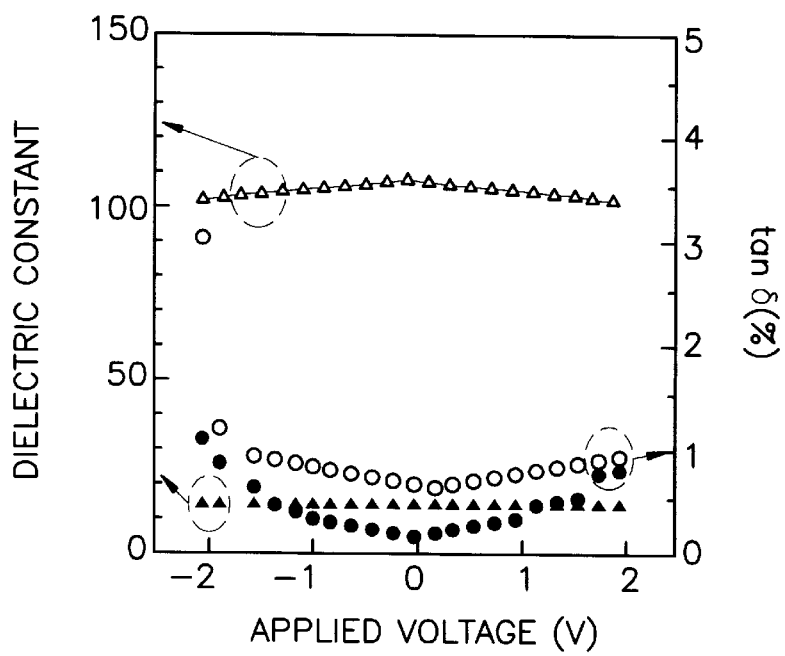
FIG. 6 is a graph showing the relationship between applied voltages and dielectric constant of a capacitor and dielectric loss (tan δ) of a capacitor in the cases of performing and of not performing annealing of a BST film after forming the same.

Observation of Relationship Between Performance of Annealing on BST Film and Dielectric Constant A plurality of substrates were deposited with BST films and divided into two groups, that is, an annealed group and a non-annealed group, according to the same conditions as those in the second example, and then a second Pt film for an upper electrode was formed. Subsequently, while applying voltages of between −2 V and +2 V to the substrates of the respective groups, dielectric constant (E) and dielectric loss (tan δ) were measured. The measurement results are demonstrated in Table 4 and FIG. 6. In FIG. 6, the points -▲--●- indicate the case of performing no annealing, and the points -Δ--○- indicates the case of performing annealing.

TABLE 4

Performance of annealing, dielectric constant and dielectric loss

| Annealing after depositing BST film | Dielectric constant (E) | Dielectric loss (tan δ) (%) |
|---|---|---|
| No | 14.85 | 0.147 |
| Yes | 108 | 0.738 |

As demonstrated in Table 4 and FIG. 6, when annealing was not performed, no high dielectric characteristic is exhibited at all. However, when annealing was performed, the dielectric constant was increased although still was relatively low at 108, and the dielectric loss was reduced.

EXAMPLE 4

Observation of Relationship Between Performance of Annealing after Forming Second Pt Film and Leakage Current To verify the change in electrical characteristics of an amorphous BST film in the case of annealing the BST film after forming the second Pt film for an upper electrode, an oxide film and a first Pt film were formed on each of a plurality of semiconductor substrates. BST films were then formed according to the deposition conditions shown in Table 1. The second Pt films for upper electrodes were formed on the BST films, to a thickness of 1000 Å, to form a capacitor. Subsequently, annealing was performed at a temperature ramping rate of 120° C./min under a nitrogen ($N_2$) atmosphere for 30 minutes. At this time, the plurality of substrates were divided into two groups. Then, annealing was performed at 600° C. for one group, and annealing was performed at 750° C. for 30 minutes for the other group. Voltages of +1.5 V and −1.5 V were applied to the respective groups, to measure leakage current characteristics. The measurement results are shown in the following Table 5 and FIG. 7.

TABLE 5

Annealing temperature and leakage current

| | | Applied voltage | |
|---|---|---|---|
| | | +1.5 V | −1.5 V |
| Leakage current ($A/cm^2$) | No annealing | $.7 \times 10^{-6}$ | $1.4 \times 10^{-6}$ |
| | Annealing at 600° C. | $2.2 \times 10^{-7}$ | $2.3 \times 10^{-7}$ |
| | Annealing at 750° C. | $7.7 \times 10^{-8}$ | $3.6 \times 10^{-8}$ |

Figure 7:
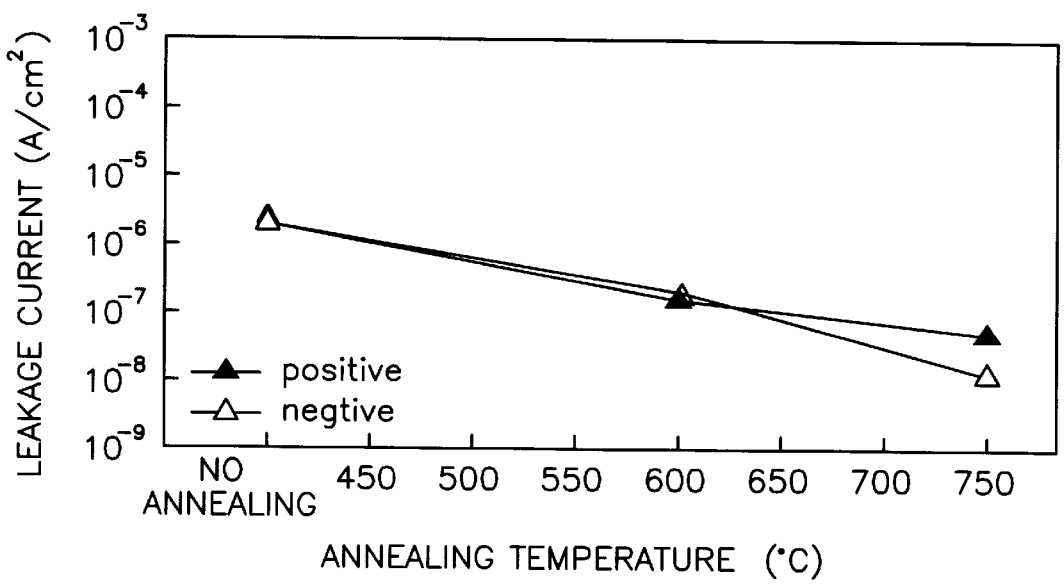
FIG. 7 is a graph showing the relationship between annealing temperature and leakage current of a capacitor, in the case of annealing the upper electrode under a nitrogen ($N_2$) atmosphere.

As demonstrated in Table 5 and FIG. 7, if annealing was performed after forming the upper electrode, i.e., the second Pt film, then the leakage current of the capacitor was decreased. Particularly, as the annealing temperature became higher, the leakage current level was decreased. It is presumed that an efficient Schottky barrier is formed between the Pt film and BST film by the annealing process which decreases the leakage current.

EXAMPLE 5

Figure 8:
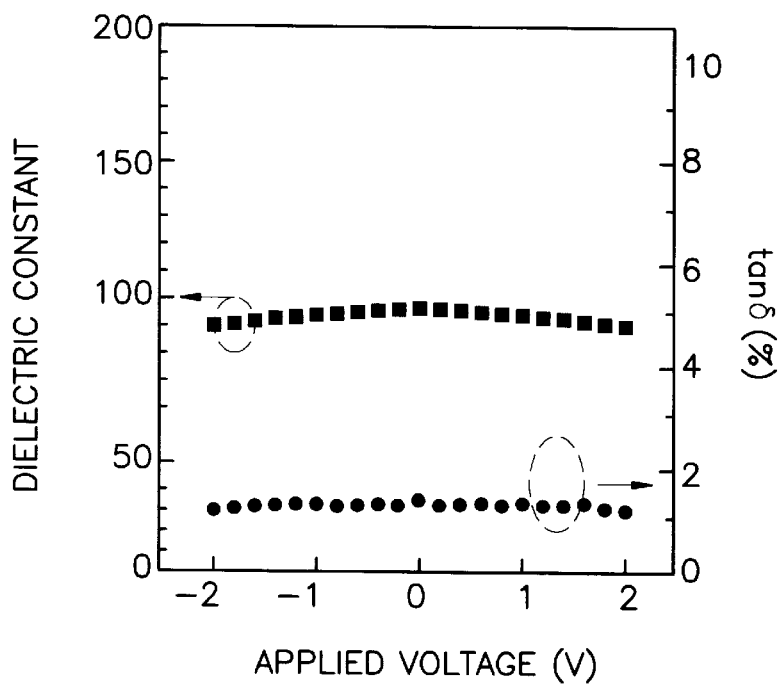
FIG. 8 is a graph showing the relationship between applied voltage and dielectric constant of a capacitor and the relationship between applied voltage and dielectric loss (tan δ) of a capacitor, in the case of annealing at 600° C. after forming the upper electrode.
Figure 9:
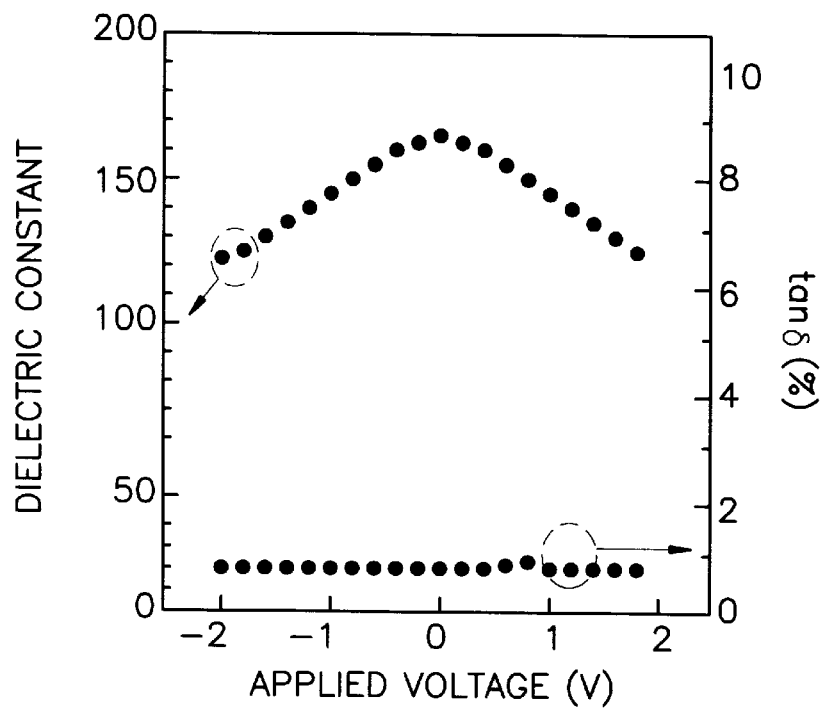
FIG. 9 is a graph showing the relationships between applied voltage and dielectric constant of a capacitor and the relationship between applied voltage and dielectric loss (tan δ) of a capacitor in the case of annealing the upper electrode at 750° C.

Observation of Relationship Between Performance of Annealing after Forming Second Pt Film and Dielectric Constant Annealing was performed at different annealing temperatures for two groups in the same manner as in Example 4. Voltages between −2 V and +2 V were then applied to the respective groups to then measure dielectric constant (E) and dielectric loss (tan δ). The measurement results are shown in the following Table 6. FIG. 8 shows the case of performing annealing at 600° C., and FIG. 9 shows the case of performing annealing at 750° C.

TABLE 6

Annealing temperature, dielectric constant and dielectric loss

| Annealing temperature after forming second Pt film (° C.) | Dielectric constant (E) | Dielectric loss (tan δ) (%) |
|---|---|---|
| 600 | 92 | 0.80 |
| 750 | 163 | 0.88 |

As demonstrated in Table 6 and FIGS. 8 and 9, if annealing was performed after forming the second Pt film, the dielectric constant was increased and the dielectric loss was decreased. Also, as the annealing temperature became higher, the dielectric constant was increased more. Therefore, as can be seen from the fourth and fifth examples, if annealing is performed after forming the second Pt film, i.e., after completing the capacitor, then the amorphous BST film is completely crystallized, and exhibits excellent electrical properties.

EXAMPLE 6

Observation of Relationship Between Performance of Two-step Annealing and Leakage Current To verify the change in electrical properties of a BST film in the case of performing annealing once after depositing the BST film and then again after forming a second Pt film, a silicon oxide film and a first Pt film for a lower electrode were formed on each of a plurality of substrates, and then a BST film was formed thereon according to the deposition conditions shown in Table 1. Subsequently, a first annealing was performed at 750° C. for 30 minutes. A second Pt film was formed on the annealed BST film, to a thickness of 1000 Å, and then a second annealing was performed again under nitrogen atmosphere for 30 minutes. The second annealing was performed such that the plurality of substrates were divided into two groups. The first group was annealed at 600° C. and the second group was annealed at 750° C. Voltages of +1.5 V and −1.5 V were applied to the respective groups to measure leakage current characteristics. The measurement results are demonstrated in the following Table 7 and FIG. 10.

TABLE 7

Performance of annealing at two stages and leakage current

| | Annealing after | Applied voltage | |
|---|---|---|---|
| Annealing after forming BST film | Annealing after forming second PT film | +1.5 V | −1.5 V |
| Leakage current (A/cm$^2$) | No | No | $1.7 \times 10^{-6}$ | $1.4 \times 10^{-6}$ |
| | | at 600° C. | $2.2 \times 10^{-7}$ | $2.3 \times 10^{-7}$ |
| | | at 750° C. | $7.7 \times 10^{-8}$ | $3.6 \times 10^{-8}$ |
| | Yes | No | $\geq 1 \times 10^{-3}$ | $\geq 1 \times 10^{-3}$ |
| | Yes | at 600° C. | $2.2 \times 10^{-7}$ | $2.5 \times 10^{-7}$ |
| | Yes | at 750° C. | $3.2 \times 10^{-4}$ | $1.7 \times 10^{-8}$ |

Figure 10:
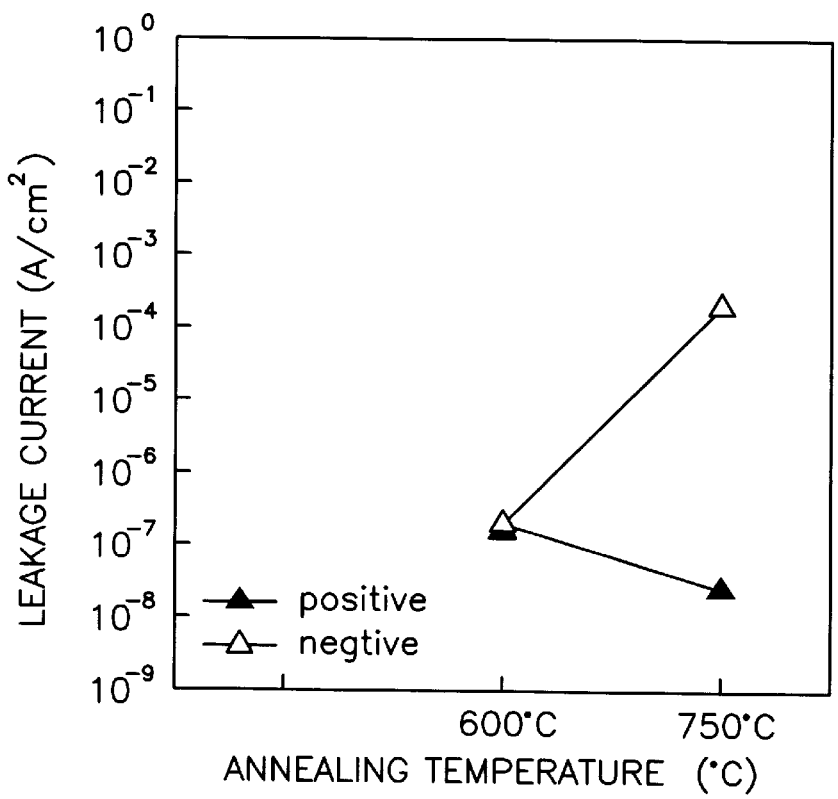
FIG. 10 is a graph showing the relationship between annealing temperature after forming an upper electrode and leakage current of a capacitor, in the case of first annealing after forming the BST film and annealing again after forming the upper electrode.

As demonstrated in Table 7 and FIG. 10, in the case of annealing once after depositing the BST film and then annealing again after forming the second Pt film, the leakage current level was decreased, compared to the cases of not annealing or annealing only after depositing the BST film or of performing no annealing. If a negative voltage is applied in the case of performing the second annealing at 750° C., the leakage current level is decreased to $1.7 \times 10^{-8}$. However, if a positive voltage is applied, the leakage current level is increased to $3.2 \times 10^{-4}$. As shown in the Table 7, in the case of performing no annealing after forming the BST film and performing annealing at 750° C. after forming the second Pt film, the leakage current level was lower than that in the case of performing two-step annealing. Thus, it is understood that two-step annealing deteriorates leakage current characteristics.

EXAMPLE 7

Figure 11:
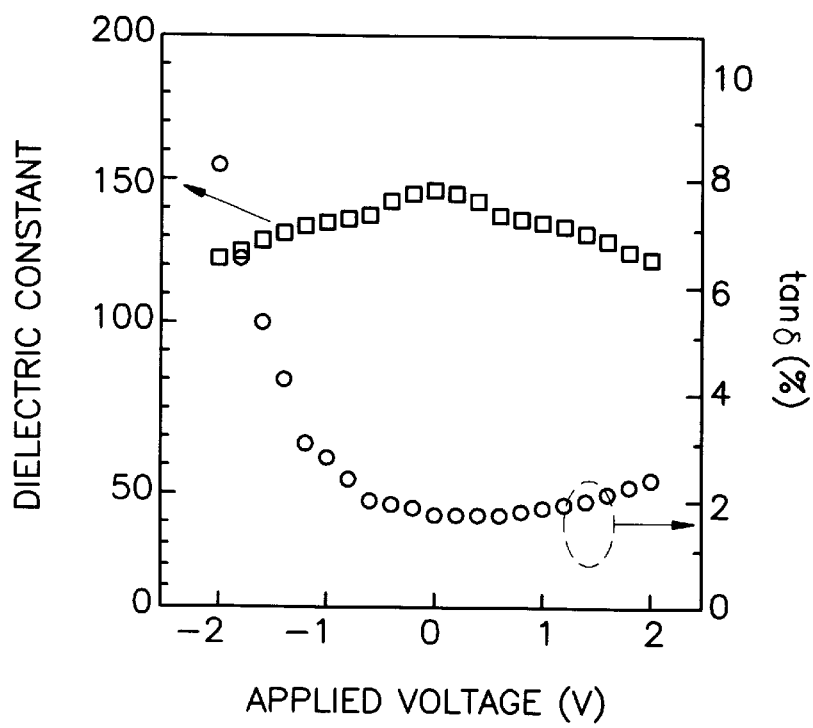
FIG. 11 is a graph showing the relationships between applied voltage and dielectric constants of a capacitor and the relationship between applied voltage and dielectric loss (tan δ) of a capacitor, in the case of annealing after forming a BST film and annealing at 600° C. after forming the upper electrode.

Observation of Relationship Between Performance of Two-step Annealing and Dielectric Constant Annealing was performed for two groups in the same manner as that of the sixth example and then voltages of between −2 V and +2 V were applied to the respective groups, to measure dielectric constant (E) and dielectric loss (tan δ). The measurement results are demonstrated in the following Table 8. FIG. 11 shows the case of performing the second annealing at 600° C., and FIG. 9 shows the case of performing the second annealing at 750° C.

TABLE 8

Performance of annealing at two stages, dielectric constant and dielectric loss

| Annealing after forming BST film | Annealing after forming second PT film | Dielectric constant (E) | Dielectric Loss (tan δ) (%) |
|---|---|---|---|
| No | No | 14.85 | 0.147 |
| Yes | No | 108 | 0.738 |
| No | 600° C. | 92 | 0.80 |
| | 750° C. | 163 | 0.88 |
| Yes | 600° C. | 140 | 1.0 |
| | 750° C. | 150 | 0.87 |

Figure 12:
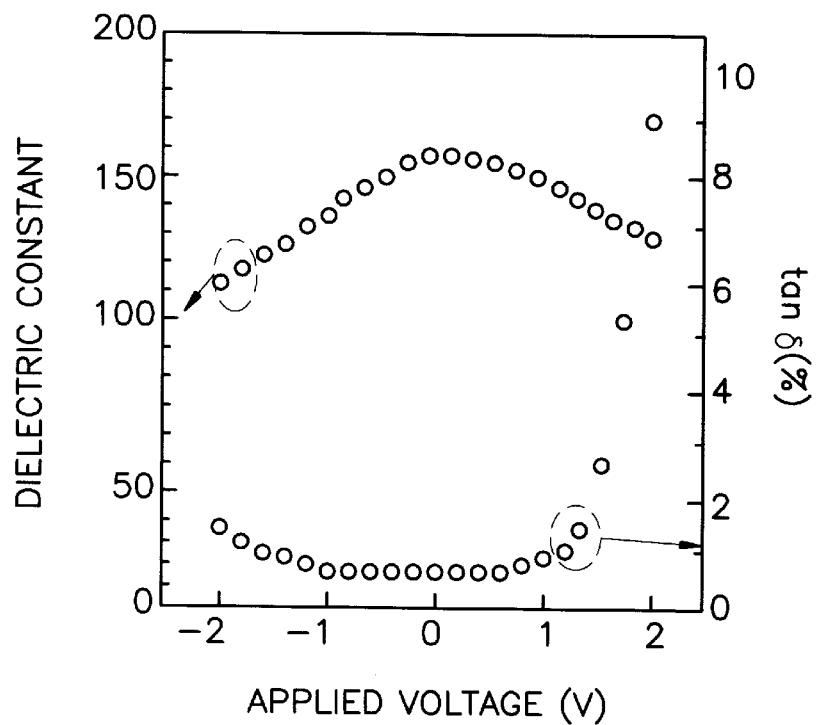
FIG. 12 is a graph showing the relationship between applied voltage and dielectric constant of a capacitor and dielectric loss (tan δ), in the case of annealing after forming a BST film and annealing at 750° C. after forming the upper electrode.

As demonstrated in Table 8, in the case of annealing once after forming the BST film, and annealing again after forming the second Pt film, the dielectric constant was increased. However, as shown in FIGS. 11 and 12, if an applied voltage exceeds 1 V, the dielectric loss is sharply increased. To compare this result with that of the fifth example shown in FIG. 9, the dielectric constant of FIG. 9 was higher than that in the case of annealing at 750° C. after depositing the second Pt film. Also, the dielectric loss was even irrespective of applied voltages.

From the results of the first through seventh example, it is understood that the amorphous BST film is crystallized so that the dielectric constant thereof is improved and the leakage current of a capacitor is decreased, if annealing is performed under a non-oxidizing atmosphere, e.g. nitrogen atmosphere, after forming the second Pt film for an upper electrode.

As described above, according to the present invention, after forming an amorphous high dielectric film at low temperature, the amorphous high dielectric film is annealed at high temperature, thereby increasing dielectric constant. In the particular case of using CVD, the high dielectric film is deposited at a temperature where step coverage of the high dielectric film exceeds 80%. Accordingly, step coverage of the high dielectric film is improved. Also, a capacitor cell unit is annealed under a non-oxidizing atmosphere after forming the upper electrode, thereby crystallizing the amorphous high dielectric film. Therefore, the dielectric constant of the capacitor is increased and the leakage current is decreased.

Although the BST film is formed by MOCVD in the second through seventh examples, another method may be used to form the BST film. Namely, although preferred embodiments of the present invention have been described in detail with reference to drawings, and specific terms have been used, the invention is not limited to the above-described embodiments, and various modifications may be evidently effected by one skilled in the art, within the scope and spirit of the invention.

What is claimed is:

1. A method for manufacturing a semiconductor device comprising the steps of:

providing a semiconductor substrate;

forming a capacitor cell unit comprised of a high dielectric film including an amorphous portion of the semiconductor substrate; and crystallizing substantially all of the high dielectric film including an amorphous portion by annealing the capacitor cell unit, to form a single-layer crystallized high dielectric film.

2. The method of claim 1, wherein the step of forming the capacitor cell unit includes the step of:

forming the amorphous high dielectric film by chemical vapor deposition at a deposition temperature selected to achieve step coverage by the high dielectric film of at least about 80%.

3. The method of claim 2, wherein the deposition temperature is 480° C. or less.

4. The method of claim 2, wherein the high dielectric material is one selected from the group consisting of $SrTiO_3$, $(Ba, Sr)TiO_3$, $PbZrTiO_3$, $SrBi_2Ta_2O_9$, $(Pb, La)(Zr, Ti)O_3$ and $Bi_4Ti_3O_{12}$.

5. The method of claim 1, wherein the step of forming the capacitor cell unit includes the step of:

forming the amorphous high dielectric film by sputtering.

6. The method of claim 1, wherein the step of crystallizing the amorphous high dielectric film includes the step of:

annealing the capacitor cell unit at 500~800° C. under a non-oxidizing atmosphere.

7. The method of claim 1, wherein the step of forming the capacitor cell unit includes the steps of:

forming a first conductive film pattern on the semiconductor substrate;

forming the amorphous high dielectric film on the first conductive film pattern;

forming a second conductive film on the high dielectric film; and patterning the second conductive film and the high dielectric film.

8. The method of claim 7, wherein the first conductive film pattern and the second conductive film are formed of a material resistant to oxidation.

9. The method of claim 8, wherein the material resistant to oxidation comprises a platinum group metal or a conductive platinum group metal oxide.

10. The method of claim 7, wherein the step of forming the amorphous high dielectric film on the first conductive film pattern includes the step of:

depositing a high dielectric material from a chemical vapor at a temperature selected to achieve the step coverage of the high dielectric film of at least about 80%.

11. The method of claim 7, wherein the step of forming the amorphous high dielectric film on the first conductive film pattern includes the step of:

forming the amorphous high dielectric film on the first conductive film pattern by sputtering.

12. A method for manufacturing a semiconductor capacitor comprising the steps of:

providing a semiconductor substrate;

forming a first conductive film pattern on the semiconductor substrate;

forming an amorphous high dielectric film on the first conductive film pattern;

forming a second conductive film on the amorphous high dielectric film;

forming a capacitor cell unit by patterning the second conductive film and the amorphous high dielectric film; and crystallizing substantially all of the amorphous high dielectric film by annealing the capacitor cell unit.

13. The method of claim 12, wherein the first conductive film pattern and the second conductive film comprise a platinum group metal or a conductive platinum group metal oxide.

14. The method of claim 12, wherein the step of forming the amorphous high dielectric film includes the step of:

depositing a high dielectric material from a chemical vapor at a deposition temperature selected to provide a step coverage of at least about 80%.

15. The method of claim 14, wherein the high dielectric material is selected from the group consisting of $SrTiO_3$, $(Ba, Sr)TiO_3$, $PbZrTiO_3$, $SrBi_2Ta_2O_9$, $(Pb, La)(Zr, Ti)O_3$ and $Bi_4Ti_3O_{12}$.

16. The method of claim 12, wherein the step of forming the amorphous high dielectric film includes the step of:

forming the amorphous high dielectric film by sputtering.

17. The method of claim 12, wherein the deposition temperature is 480° C. or less.

18. The method of claim 12, wherein the step of annealing the capacitor cell unit is performed at 500~800° C. under a non-oxidizing atmosphere.

19. A method for manufacturing a semiconductor capacitor comprising the steps of:

providing a semiconductor substrate;

forming an insulating film having a contact plug, on the semiconductor substrate;

sequentially forming a diffusion preventing film pattern and a first conductive film pattern comprised of a metal resistant to oxidation or a conductive platinum group metal, on the insulating film;

forming an amorphous high dielectric film on the first conductive film pattern by depositing a high dielectric material at a temperature of 480° C. or less;

forming a second conductive film on the high dielectric film;

forming a capacitor cell unit by sequentially patterning the second conductive film and the high dielectric film; and crystallizing the amorphous high dielectric film by annealing the capacitor cell unit at a temperature of 500~800° C. under a non-oxidizing atmosphere.

20. A method for manufacturing a semiconductor capacitor comprising the steps of:

providing a semiconductor substrate;

forming a first conductive film pattern on the semiconductor substrate;

forming a high dielectric film on the first conductive film pattern;

forming a second conductive film on the high dielectric film;

crystallizing the high dielectric film by annealing the resultant structure having the second conductive film to form a single-layer crystallized high dielectric film; and patterning the second conductive film and the crystallized high dielectric film.

* * * * *